(12) United States Patent
Han et al.

(10) Patent No.: US 7,351,635 B2
(45) Date of Patent: Apr. 1, 2008

(54) METHOD OF FABRICATING MICROELECTRONIC DEVICE USING SUPER CRITICAL FLUID

(75) Inventors: Sang-Cheol Han, Seoul (KR); Jun-Hwan Oh, Incheon-si (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 11/033,712

(22) Filed: Jan. 12, 2005

(65) Prior Publication Data

US 2005/0153566 A1  Jul. 14, 2005

(30) Foreign Application Priority Data

Jan. 14, 2004  (KR) .................. 10-2004-0002754

(51) Int. Cl.
*H01L 21/8242* (2006.01)
(52) U.S. Cl. .............. 438/253; 438/626; 438/627; 438/629; 438/634; 438/637; 438/636; 257/E21.579
(58) Field of Classification Search ............... None
See application file for complete search history.

(56) References Cited

U.S. PATENT DOCUMENTS

| | | | | |
|---|---|---|---|---|
| 5,063,267 A | * | 11/1991 | Hanneman et al. | 524/284 |
| 6,057,239 A | * | 5/2000 | Wang et al. | 438/689 |
| 6,297,149 B1 | * | 10/2001 | Stamper | 438/637 |
| 6,406,995 B1 | * | 6/2002 | Hussein et al. | 438/638 |
| 6,425,956 B1 | | 7/2002 | Cotte et al. | 134/3 |
| 6,500,605 B1 | | 12/2002 | Mullee et al. | 430/329 |
| 6,537,916 B2 | | 3/2003 | Mullee et al. | 438/692 |
| 7,080,651 B2 | | 7/2006 | Mizobata et al. | |
| 2002/0170577 A1 | | 11/2002 | Mizobata et al. | |
| 2004/0142564 A1 | * | 7/2004 | Mullee et al. | 438/689 |
| 2004/0183203 A1 | * | 9/2004 | Meagley et al. | 257/774 |
| 2004/0198066 A1 | * | 10/2004 | Verhaverbeke | 438/745 |

FOREIGN PATENT DOCUMENTS

| | | |
|---|---|---|
| CN | 1384535 A | 12/2002 |
| CN | 1387236 A | 12/2002 |
| JP | 2002-222786 | 8/2002 |

OTHER PUBLICATIONS

First Office Action and English translation, issued by The Patent Office of the People's Republic of China for related Application No. 2005100565652, dated Jan. 19, 2007.

* cited by examiner

*Primary Examiner*—Michael Lebentritt
*Assistant Examiner*—Kyoung Lee
(74) *Attorney, Agent, or Firm*—Mills & Onello LLP

(57) ABSTRACT

Methods of fabricating a microelectronic device having improved performance characteristics are disclosed which are characterized by using super critical fluid to perform a material removal step. In one illustrative embodiment, the method includes preparing a substrate, forming an HSQ layer covering at least a portion of the substrate, and thereafter removing at least portions of the HSQ layer using super critical fluid $CO_2$.

30 Claims, 13 Drawing Sheets

METHOD OF FABRICATING MICROELECTRONIC DEVICE USING SUPER CRITICAL FLUID

CROSS-REFERENCE TO RELATED APPLICATION

This application claims the benefit of Korean Patent Application No. 2004-2754, filed on Jan. 14, 2004, the disclosure of which is hereby incorporated herein by reference in its entirety.

BACKGROUND OF THE INVENTION

1. Field of the Invention

The present invention relates to a method of fabricating a microelectronic device, and more particularly, to a method of fabricating a microelectronic device using super critical fluid.

2. Discussion of the Related Art

A microelectronic device such as a highly-integrated semiconductor device is structured such that elements in its upper and lower portions are connected to each other via a multilayer structure of metal interconnections. Since a metal layer is relatively difficult to etch in comparison with an insulating layer, a dual damascene process is used to pattern the metal layer. U.S. Pat. No. 6,057,239, by Fei Wang, et. al. which is incorporated herein by reference, discloses a dual damascene process using sacrificial spin-on material.

Hereinafter, a method of forming a dual damascene interconnection according to a prior art technique will be explained in reference to FIGS. 1A to 1G.

Referring to FIG. 1A, a semiconductor substrate 10 is prepared with lower metal interconnections 11 thereon, which are insulated by an insulating layer 12. Then, an etch stop layer 13, an interlayer insulating layer 14, and a capping layer 15 are sequentially formed on the lower metal interconnections 11 and the insulating layer 12.

Referring to FIG. 1B, a first photoresist pattern PR1 for defining a via is formed on the capping layer 15 of FIG. 1A. Then, the capping layer 15 and the interlayer insulating layer 14 are etched using the photoresist pattern PR1 as an etch mask. Thus, one or a plurality of openings V are formed inside the etched interlayer insulating layer 14a and the etched capping layer 15a. Each opening V comprises a via portion V1 and a preliminary trench portion V2 extending upward from the via V1.

Referring to FIG. 1C, the photoresist pattern PR1 of FIG. 1B is removed, and a sacrificial layer 16 is formed on the exposed surfaces of the semiconductor device so as to fill the openings V. Then, a second photoresist pattern PR2 is formed on the sacrificial layer 16 for defining a trench. The sacrificial layer 16 is formed to prevent the lower metal interconnection 11 from being exposed too early because the etch stop layer 13, which has a lower etch selectivity relative to the interlayer insulating layer 14a, is removed during the etching process of etching the interlayer insulating layer 14a in forming the trench.

Referring to FIG. 1D, the sacrificial layer 16, the capping layer 15a, and the interlayer insulating layer 14a as seen in FIG. 1C are etched using the photoresist pattern PR2 as an etch mask. Thus, a trench T, generally in the same region of the device as the preliminary trench V2, is formed inside the capping layer 15a and the interlayer insulating layer 14a. Following this etching step, the sacrificial layer portions 16a and 16b remain respectively inside the via V1 and on the capping layer 15a.

Referring to FIG. 1E, the photoresist pattern PR2 of FIG. 1D is removed.

Referring to FIG. 1F, the sacrificial layer portions 16a and 16b, which remained inside the via V1 and over the interlayer insulating layer 14a in FIG. 1E, are now removed. The sacrificial layers 16a and 16b are typically removed by a wet etching process. For example, if the interlayer insulating layer 14 is composed of SiOC:H, and the sacrificial layer 16 is composed of hydrogen silsesquioxane (HSQ), the sacrificial layers 16a, 16b are removed by a wet etching process using diluted hydrofluoric acid. During the initial part of the process wherein the sacrificial layers 16a, 16b are removed by the wet etching process, while the etch stop layer 13 is still covered by the sacrificial layer 16a, the capping layer 15a having exposed sidewalls is typically damaged by wet etchant such that its width is reduced. That is, if a width of the capping layer 15a before the wet etching process is performed is 'W1', a width of the capping layer 15a after the wet etching process is performed is reduced to a smaller width 'W2'. Further, an upper surface of the interlayer insulating layer 14a is also typically damaged by the wet etchant, which penetrates through into the interface between the interlayer insulating layer 14a and the capping layer 15a, thereby generating an undercut U. Due to the undercut U, a lifting of the capping layer 15a from contact with layer 14a may occur.

Further, the interlayer insulating layer 14a is ordinarily formed of a low-k dielectric layer in order to reduce a parasitic capacitance between the interconnections. The low-k dielectric layer typically has porous and high moisture absorbance properties. As described above, while the sacrificial layers 16a, 16b are being removed by the wet etching process, moisture commonly penetrates through into the interlayer insulating layer 14a, thereby generating silanol groups (Si—OH bonds). Formation of such silanol groups increases a dielectric constant of the interlayer insulating layer 14a. Therefore, it is usually necessary to perform an additional annealing process at a temperature higher than 400° C. in order to remove the silanol groups.

Referring to FIG. 1G, the etch stop layer 13 under the via V1 of FIG. 1F is now selectively removed. Thus, the lower metal interconnections 11 are exposed along the etched portions of etch stop layer 13a. Then, the trench T and the via V1 are filled with a conductive layer, thereby forming an upper interconnection 17. The upper interconnection 17 is formed by sequentially depositing a seed layer, a diffusion barrier layer, and a metal layer, and then performing deposition and polishing processes.

The conventional formation method of a dual damascene interconnection described as above has a number of problems and limitations, including the facts that a leakage current is normally increased, and the seed layer and the diffusion barrier layer are usually poorly deposited, thereby causing discontinuity of layers, due to the effects of the wet etching process for removing the sacrificial layers 16a, 16b, during which the capping layer 15a may be reduced in width and/or lifted.

With increasingly high integration of modern microelectronic devices, it is desirable to reduce the distance between metal interconnections. However, if the distance between metal interconnections becomes too narrow, a cross talk may occur between the metal interconnections, and a parasitic capacitance between the metal interconnections having the insulating layer formed therebetween is thereby increased. As a result, electric signals through the metal interconnections are poorly transmitted, or a transmission speed of such signals is reduced. In the formation method of a dual damascene interconnection, a parasitic capacitance can be reduced when the interlayer insulating layer 14 is composed of a low-k dielectric material. Such formation method has a problem, however, in that silanol groups are formed inside the low-k dielectric interlayer insulating layer 14a of porous property during the wet etching process of removing the sacrificial layers 16a, 16b, thereby increasing a dielectric constant. The silanol groups inside the interlayer insulating layer 14a can be removed through heating the partially formed microelectronic device at a temperature above 400° C., but some portions of other elements are then attacked and damaged due to the heating. Therefore, it is desired in this art to find a method of removing a sacrificial layer without damaging the capping layer on the interlayer insulating layer and without increasing the dielectric constant of the interlayer insulating layer.

These and other problems with and limitations of the prior art processes in this field are addressed in whole, or at least in part, by the methods and techniques of this invention.

SUMMARY OF THE INVENTION

Therefore, the present invention is directed to provide methods of fabricating a microelectronic device in which a material layer is removed using super critical fluid.

In accordance with an exemplary embodiment, the present invention provides a method of fabricating a microelectronic device which includes the steps of preparing a substrate and forming a HSQ layer covering at least a portion of the substrate. The HSQ layer is subsequently removed using super critical $CO_2$.

In accordance with another exemplary embodiment, the present invention provides a method of fabricating a microelectronic device which includes the steps of preparing a substrate, forming an interlayer insulating layer on the substrate, and selectively etching the interlayer insulating layer, thereby forming an opening inside the interlayer insulating layer. A sacrificial layer is then formed for filling at least a portion of the opening. An etch mask is formed for exposing the sacrificial layer and the interlayer insulating layer around the opening. The interlayer insulating layer and the sacrificial layer, which are exposed after forming the etch mask, are selectively etched, thereby expending an upper portion of the opening. The sacrificial layer is then removed using super critical fluid. The etch mask is removed. A conductive layer pattern is formed inside the opening.

In accordance with still another exemplary embodiment, the present invention provides a method of fabricating a microelectronic device which includes a step of preparing a substrate having a lower interconnection. An etch stop layer is formed for covering the lower interconnection. An interlayer insulating layer, which is composed of a low-k dielectric material, is formed on the etch stop layer. The interlayer insulating layer is etched until the etch stop layer is exposed, thereby forming an opening inside the interlayer insulating layer. The opening includes a via exposing the etch stop layer at a bottom thereof, and a preliminary trench extending from the via. A sacrificial layer, which is composed of a HSQ based material, is formed for filling at least a portion of the opening. A photoresist pattern is formed for exposing the sacrificial layer and the interlayer insulating layer around the opening. The interlayer insulating layer and the sacrificial layer, which are exposed after the photoresist pattern is formed, are etched, thereby forming a trench extending from the preliminary trench. The sacrificial layer and the photoresist pattern are then concurrently removed using super critical $CO_2$. The etch stop layer is thereafter removed, thereby exposing the lower interconnection. The via and the trench are next filled with a conductive layer, thereby forming an upper interconnection, which is connected to the lower interconnection through the via.

These and other useful embodiments of this invention will be described below in reference to the several drawings.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
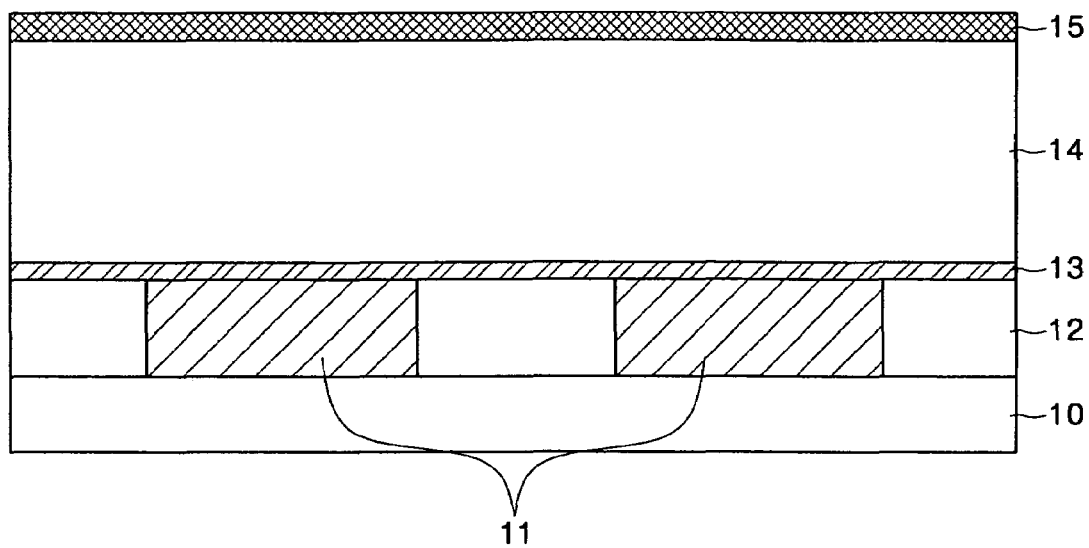
FIGS. 1A through 1G are schematic sectional views illustrating a sequence of process steps in a conventional method of forming a dual damascene interconnection.
Figure 1B:
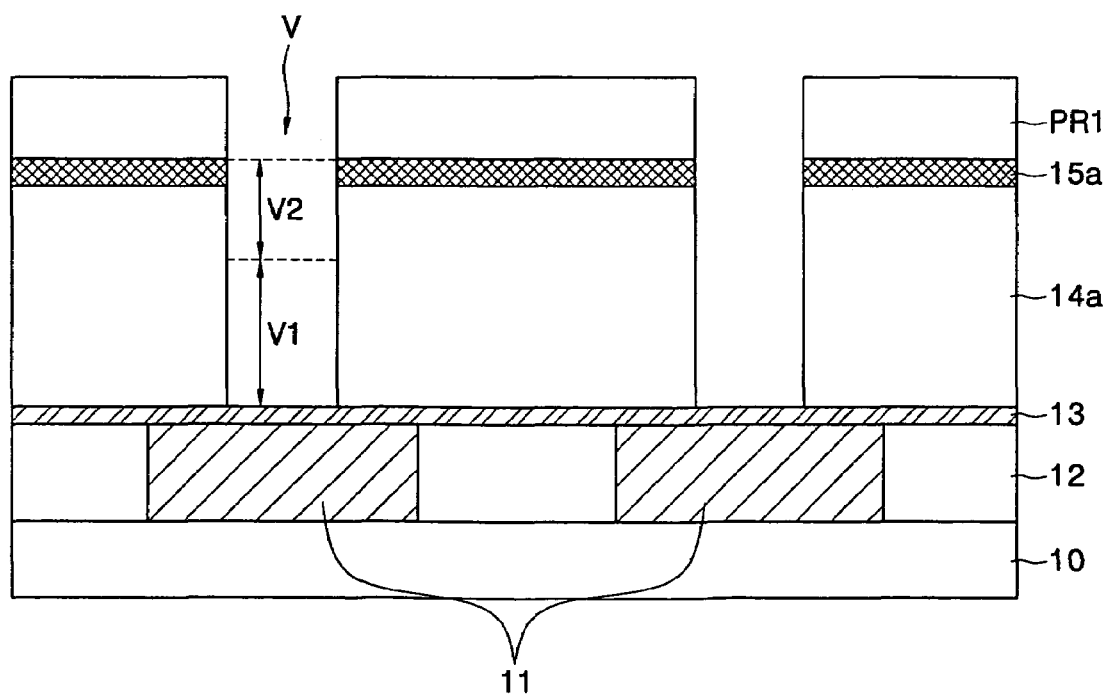
Figure 1C:
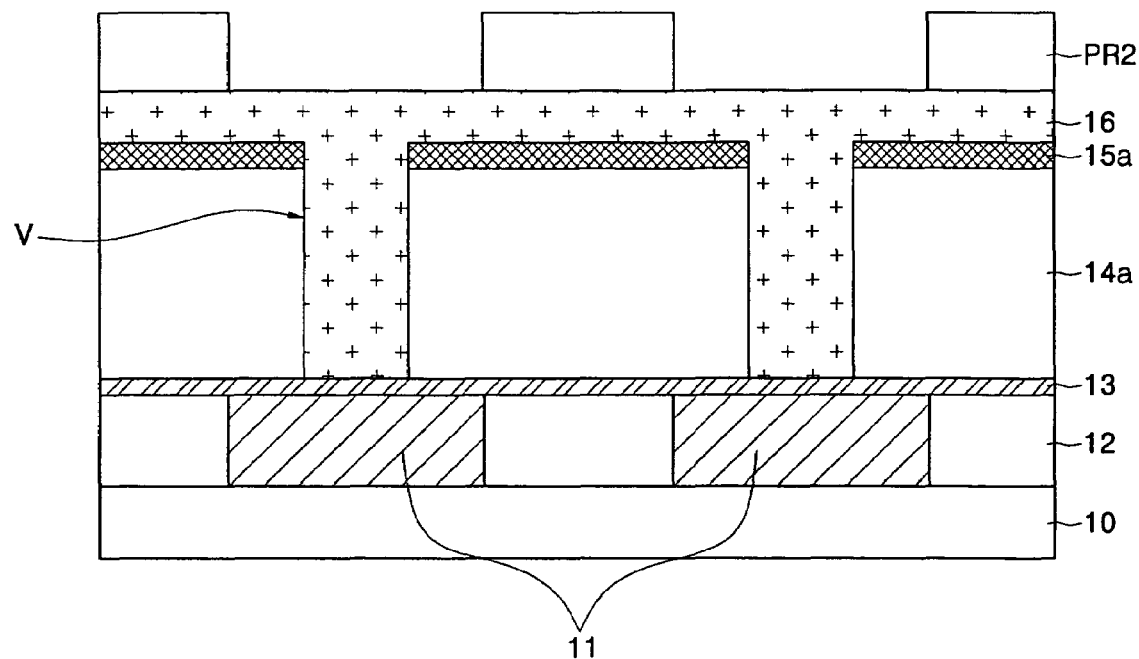
Figure 1D:
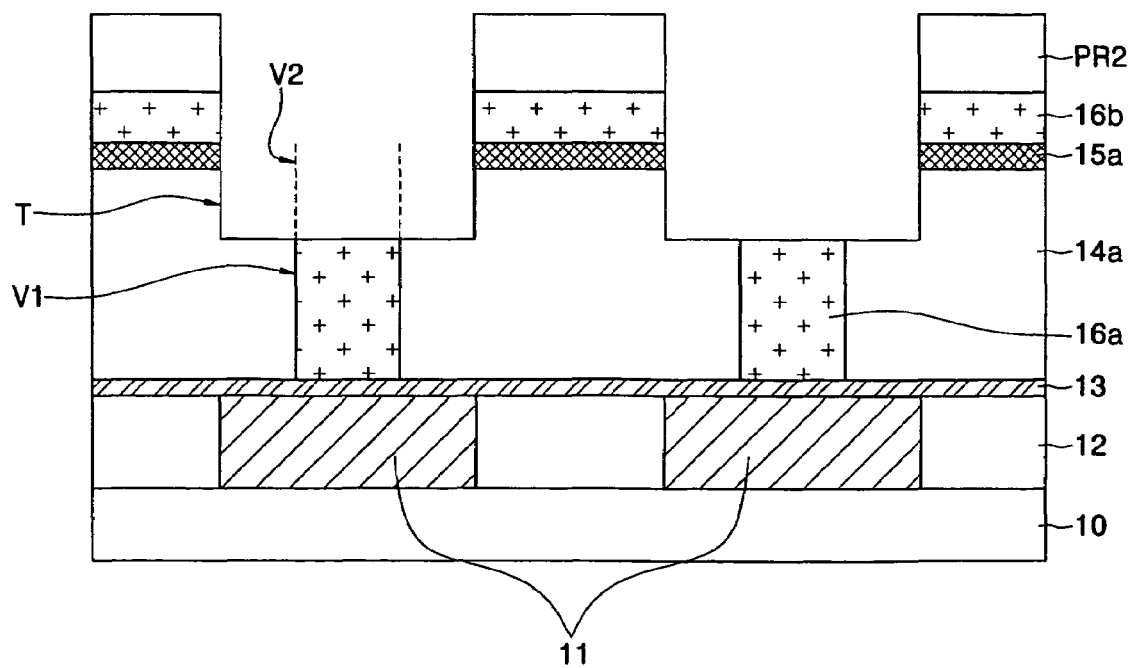
Figure 1E:
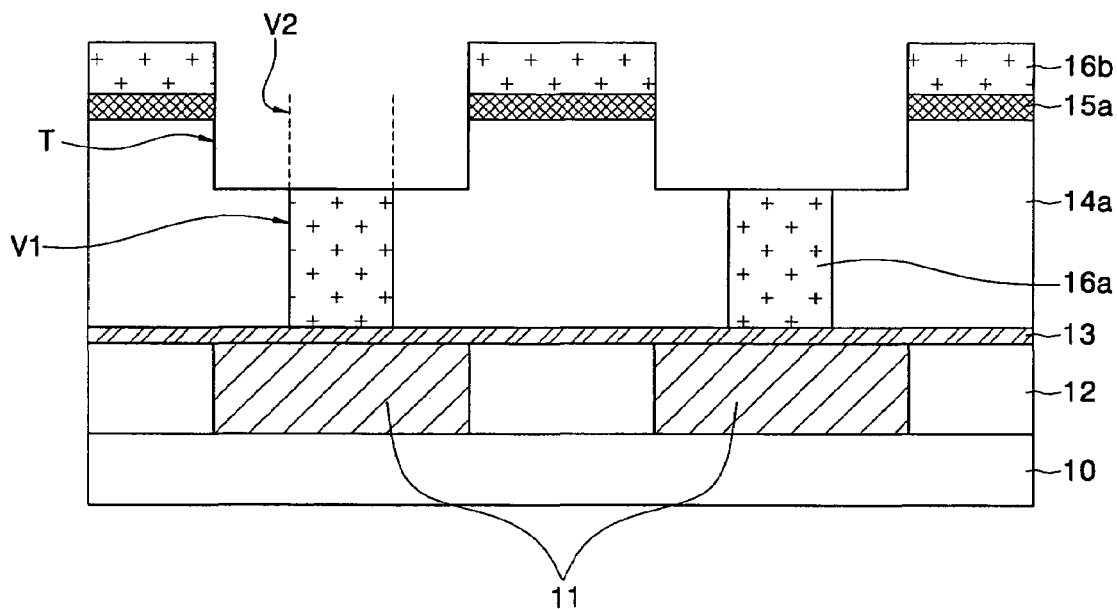
Figure 1F:
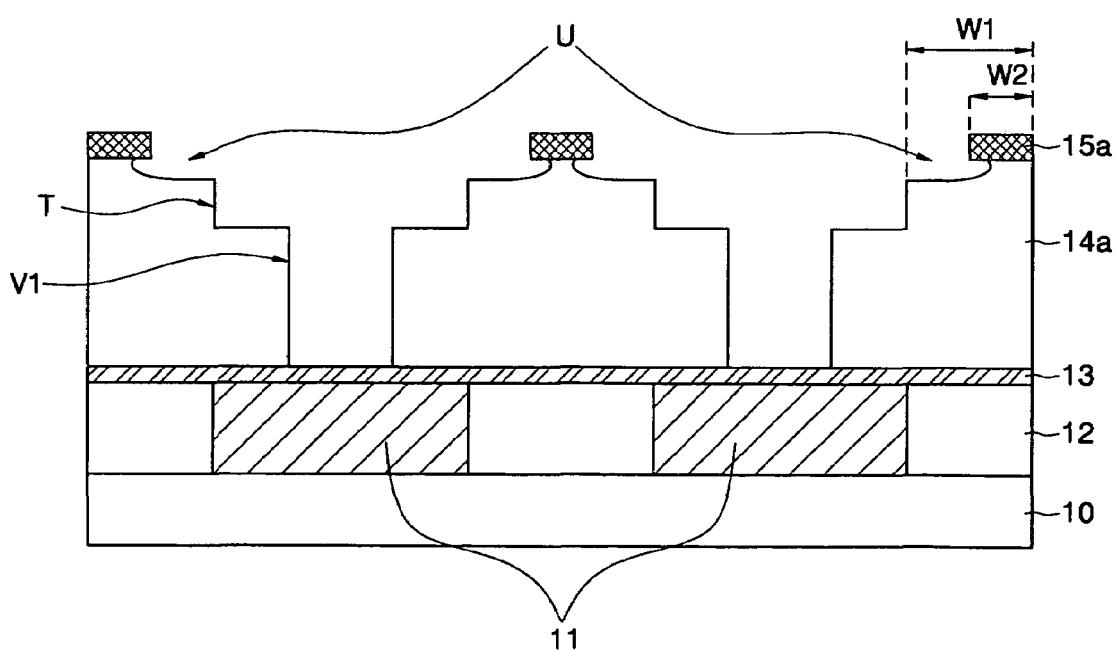
Figure 1G:
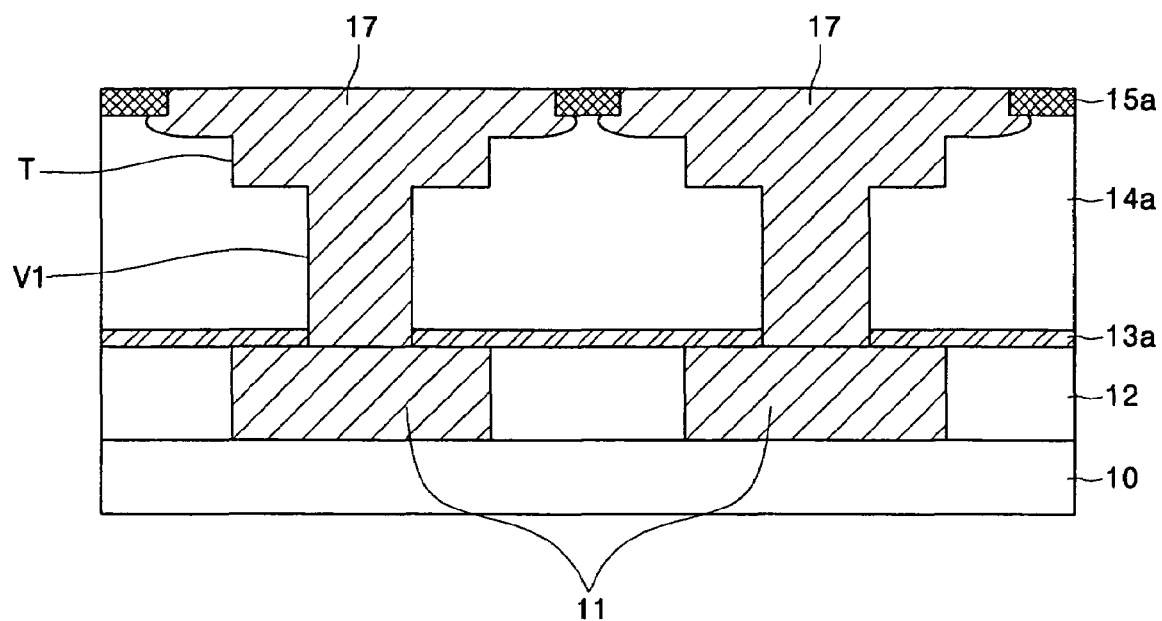

The present invention will now be described more fully hereinafter with reference to the accompanying drawings, in which preferred embodiments of the invention are shown. It will be understood, however, that this invention may be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 2:
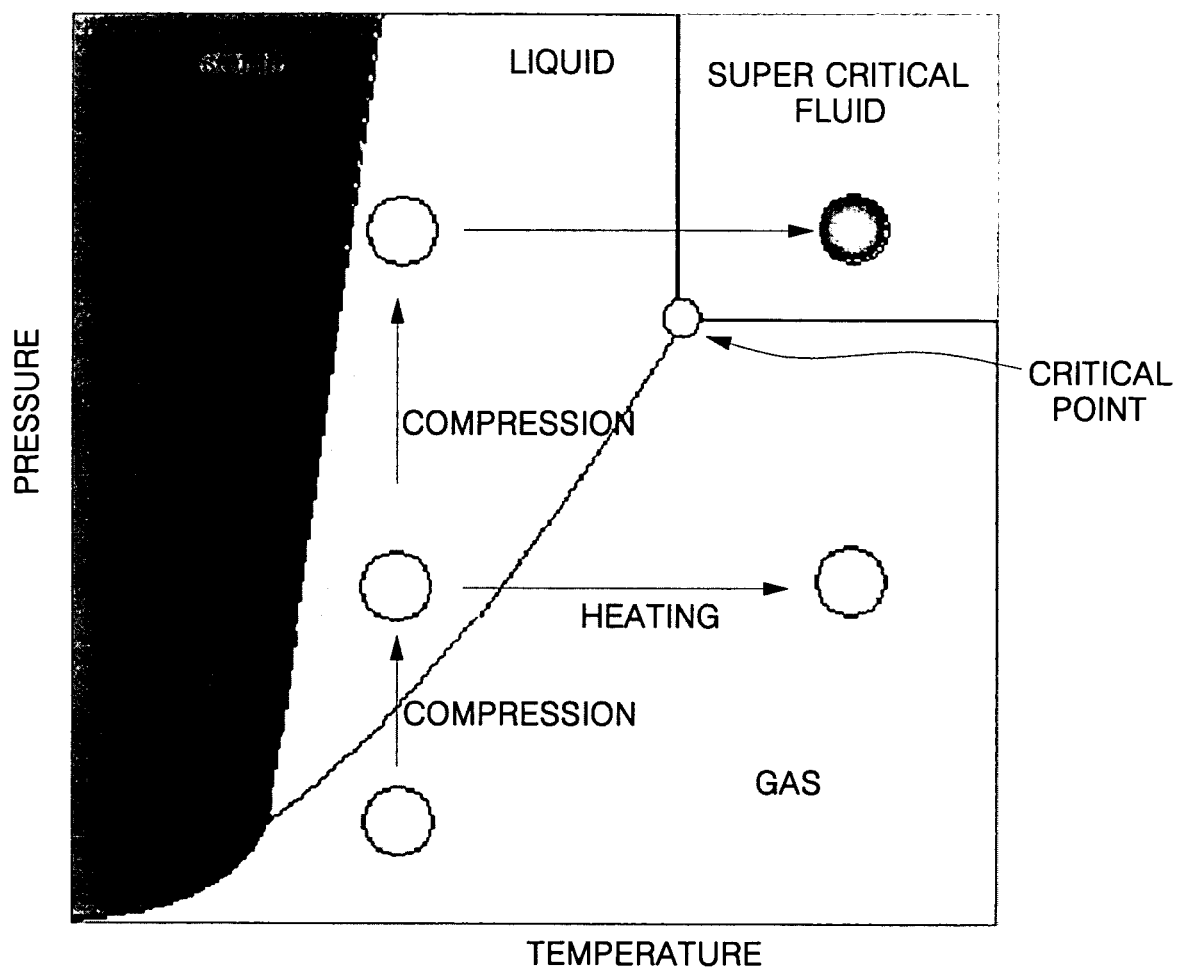
FIG. 2 is a pressure-temperature graph illustrating phase states of a material under different pressure/temperature conditions.

Embodiments of the present invention provide a method of removing a material layer using super critical fluid as part of a novel fabrication technique for preparing microelectronic devices. As shown in FIG. 2, there exists a fourth phase state besides the familiar solid, liquid, and gas phase states of a material; that fourth phase state is commonly called super critical fluid. The super critical fluid phase comprises liquid and gas phases at the same time at a temperature and with a pressure above a critical point. Such super critical fluid phase has certain advantages of both gas and liquid phases at the same time, that is, the relatively high permeability of a gas phase and the relatively high density of a liquid phase. The super critical fluid phase also has properties of high activity and high reactivity in comparison with the liquid or gas phases of a particular material. The super critical fluid phase also has properties close to those of an ideal gas because the super critical fluid can move fast in uniform even when mixed with other materials. Further, since the interaction between fluid molecules of a material in the super critical fluid state is small, the reactivity of such fluid is greatly increased, thereby shortening process time. Further, because unreacted material can be easily recollected just by effecting a slight change of a temperature and/or a pressure, use of such a super critical fluid is very economical and environmentally advantageous.

Hereinafter, a method of fabricating a microelectronic device using super critical fluid according to one embodiment of the present invention will be explained in reference to FIGS. 3A and 3B.

Figure 3A:
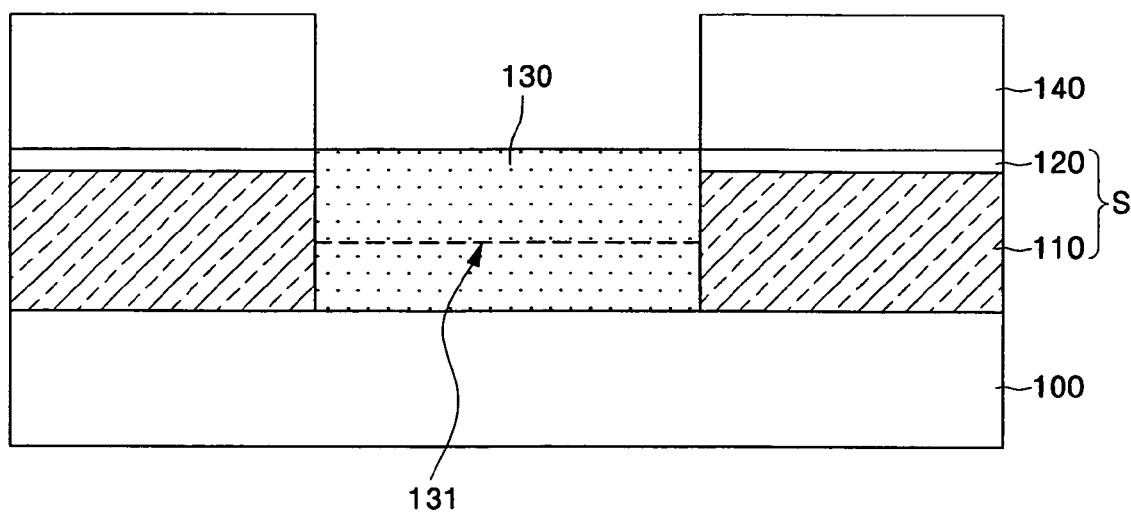
FIGS. 3A and 3B are schematic sectional views illustrating a method of fabricating a microelectronic device using super critical fluid according to one embodiment of the present invention.

Referring to FIG. 3A, a suitable substrate 100 is prepared having deposited on a surface thereof a material layer 130 exposed between an etch mask 140.

The material layer 130 may be composed of an organic material or an inorganic material. According to one embodiment of the present invention, the material layer 130 may be composed of hydrogen silsesquioxane (HSQ), borophosphosilicate glass (BPSG), phosphosilicate glass (PSG), fluorinated silicate glass (FSG), methyl silsesquioxane (MSQ), or photoresist. The material layer 130 may be a sacrificial layer, which may be formed during the fabrication of the microelectronic device.

The etch mask 140 may be composed of photoresist or silicon nitride. If the etch mask 140 is composed of photoresist, the material layer 130 and the etch mask 140 can usually be concurrently removed. Further, the etch mask 140 may cover a lower structure S that was formed on the substrate 100 during an earlier processing stage.

The lower structure S may have a stack structure including a first layer 110 and a second layer 120. The first layer 110 may be an interlayer insulating layer, and the second layer 120 may be a capping layer or a reflection preventive layer. The first layer 110 may be an interlayer insulating layer which covers a gate or a bit line of a semiconductor device, and the second layer 120 may be a capping layer. The first layer 110 may be an interlayer insulating layer which is composed of a low-k dielectric material. The first layer 110 may be composed of an organic material or an inorganic material, formed for example by a spin-on or a chemical vapor deposition (CVD) method. Further, the first layer 110 may be composed of fluorinated silicate glass (FSG) or SiOC based materials. The SiOC based dielectric material may use SiOC:H, and Black Diamond™ (which hereinafter will be referred to as BD) a product of Applied Material Co. BD is a material including a mixture of $SiO_2$ and carbon having a dielectric constant (k) of about 2.6 to 2.8. BD has a hydrophobic property due to the effect of methyl group ($-CH_3$). Alternatively, as a material similar to BD, CORAL™, a product of Novellous Co., or Aurora™, a product of ASM Co., may be used for the first layer 110. Further, SiLK™, a product of Dow Chemical Co., or LKD™, a product of JSR Co., may be used for the first layer 110. A second layer 120 as a capping layer is formed on the first layer 110. The second layer 120 may be composed of $SiO_2$, SiOF, SiON, SiC, SiN, SiCN, or chemically similar materials.

The material layer 130 fills the space between insulating layer patterns including the first layer 110 and the second layer 120. The space may be a contact hole. The space between the insulating layer patterns may be entirely or partially filled with a material layer 130. In FIG. 3A, the reference numeral '131' represents the space between the insulating layer patterns, for example, a surface of a material layer, which fills a portion of the contact hole.

Further, the first layer 110 of the lower structure S may be a conductive layer, and the second layer 120 of the lower structure S may be an insulating layer.

Figure 3B:
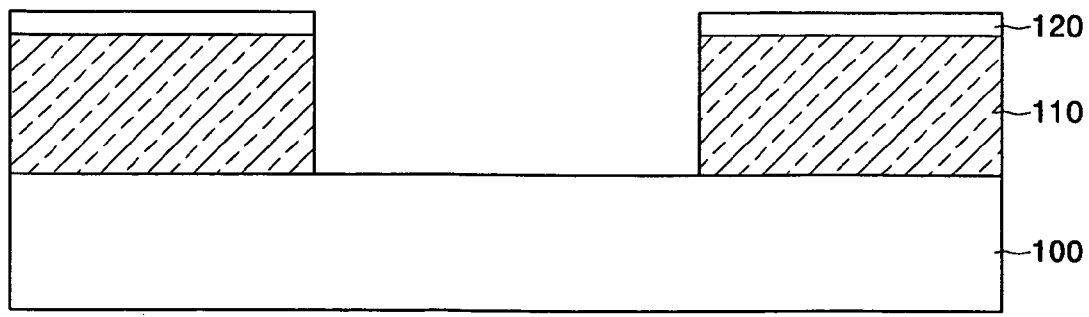

Referring next to FIG. 3B, the etch mask 140 and the material layer 130 seen in FIG. 3A have now been removed. The etch mask 140 may be removed separately before or after removing the material layer 130, or in some embodiments of this invention at the same time as removing material layer 130, depending on the material that is used for the etch mask 140.

In accordance with this invention, the material layer 130 and the etch mask 140 are removed using one or more materials in the super critical fluid state. The super critical fluid may be formed from $CO_2$, a relatively low molecular weight hydrocarbon which may include single or multiple C—C bonds (e.g., methane, ethane, propane, butane, pentane, hexane, ethylene, propylene), hydrocarbon halides, various inorganic compounds (e.g., ammonia, carbon dioxide, sulfur hexafluoride, hydrogen chloride, hydrogen sulfide, nitrogen oxide, sulfur dioxide), or chemically similar materials. Beside the above-listed materials, various other materials may be used if they can be converted into a chemically stable super critical fluid phase at a commercially practicable temperature and pressure. For example, it has been found that the material layer 130 may be effectively removed using: $NH_3$ in a super critical fluid state at a temperature higher than 133° C. and with a pressure higher than 114 bar; $NO_2$ in a super critical fluid state at a temperature higher than 158° C. and with a pressure higher than 102 bar; and $H_2O$ in a super critical fluid state at a temperature higher than 374° C. and with a pressure higher than 221 bar. Particularly, since $NH_3$, even in the super critical fluid phase, is basic, it is possible to use super critical fluid $NH_3$ to remove a material layer 130 and/or an etch mask 140 comprised of organic materials. Also, a surface of a microelectronic wafer may be made hydrophobic in order to remove particles therefrom. Since the super critical fluid $NH_3$ functions as ligand of metal ions to form stable complex ions with metal compounds, it is easy to remove metal defects and metal-containing polymer using super critical fluid $NH_3$. In the case of using super critical fluid $NH_3$, $O_3$ gas may be added to the super critical fluid, or an inert gas such as Ar, He, and similar inert gases, and/or a carrier gas, such as $N_2$ gas, may be also used.

In one preferred embodiment of the invention, the material layer 130 and the etch mask 140 are removed using super critical fluid $CO_2$. The super critical fluid $CO_2$ has properties of the liquid and gas phases at the same time at a temperature higher than 31° C. and with a pressure higher than 74 bar. The density of super critical fluid $CO_2$ is about 0.7 g/cc, which is similar to that of liquid $CO_2$, but since a viscosity thereof is lower than that of liquid, the super critical fluid $CO_2$ has a high penetration property of about $10^{-3}$ cm$^2$/sec, which is similar to that of $CO_2$ gas. That is, since the super critical fluid $CO_2$ has a higher diffusivity than that of liquid $CO_2$, and a lower surface tension than that of liquid $CO_2$, it can easily penetrate through into a narrow and long opening or groove, or a pore, which liquid-phase $CO_2$ cannot effectively penetrate. Further, the super critical fluid $CO_2$ has a relatively high density and a high solubility, desirable properties for these applications which are not seen with $CO_2$ gas. The super critical fluid $CO_2$ also shows a very low level of reactivity with metals. Further, since the super critical fluid state of $CO_2$ is achieved at a relatively low temperature around a room temperature as a super critical condition, it has advantages of being easy to handle and a high solubility relative to organic materials. Further, the super critical fluid $CO_2$ also has the advantages of being nonpoisonous, non-flammable and environment-friendly characteristics, and it is available at a relatively low price. Because super critical fluid $CO_2$ can be exhausted out of a chamber without significant environmental impact, it also has an advantage of easy process control.

Further, if small amounts of one or more specially selected additives are added into the chamber having super critical fluid $CO_2$ thereinside during step(s) for removal of material layer 130 and/or etch mask 140, even materials which are typically insoluble in $CO_2$ can be caused to react, thereby removing the materials from the microelectronic device. For example, a fluorine based material, such as HF, $NH_4F$, or an alcohol based material may be added to the chamber along with the super critical fluid $CO_2$, thereby improving an etch or removal property of the mixture. In another embodiment, hexafluoroacrylacetone (HAFC) is supplied to induce kelation, thereby easily removing typical etch by-products. In still another embodiment, hexamethyldisilazane (HMDS) or trimethylchlorosilane (TMCS) can be added as a moisture proofing material to protect the interlayer insulating layer of the first layer 110 during removal of the material layer 130.

Figure 4A:
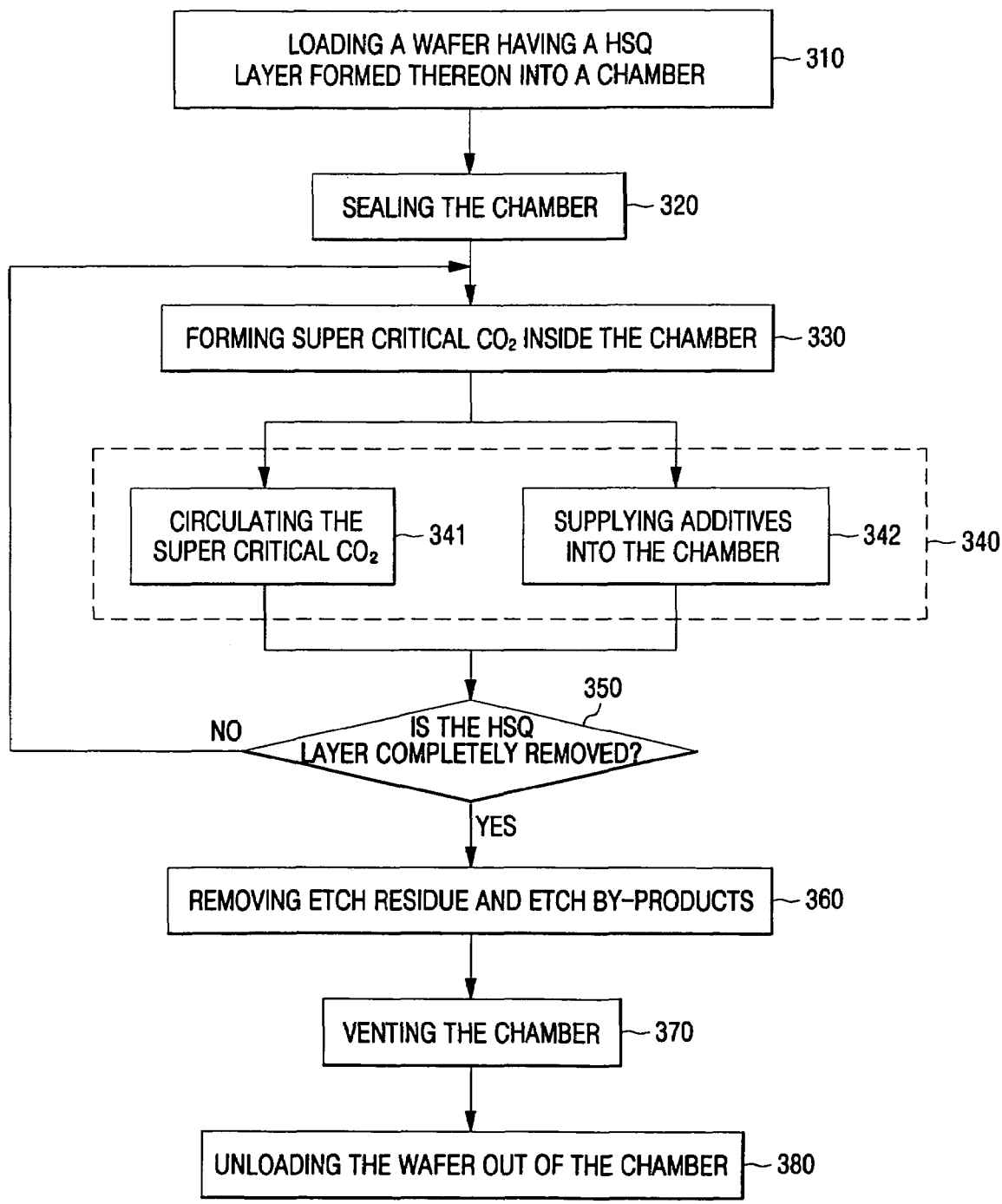
FIGS. 4A and 4B are sequence diagrams illustrating alternative methods of removing a HSQ layer using super critical $CO_2$ according to embodiments of the present invention.

Hereinafter, a method of removing an HSQ layer using super critical fluid $CO_2$ according to another embodiment of the present invention will be explained in reference to the process flow diagram of FIG. 4A.

First, a wafer having an HSQ layer formed thereon is disposed inside a chamber (step 310). The HSQ layer covers at least a portion of the wafer. The wafer may be a substrate 100 having an HSQ layer as a material layer 130, which is exposed between an etch mask 140 similar to that shown in FIG. 3A. The chamber may be a compression chamber capable of providing an increased interior pressure.

Then, the chamber is sealed (step 320).

Then, super critical fluid $CO_2$ is formed inside the chamber (step 330). The super critical fluid $CO_2$ may be formed by supplying $CO_2$ gas into the chamber, and thereafter increasing a temperature and a pressure above a critical point. That is, $CO_2$ gas is converted to the super critical fluid phase at a temperature of about 30 to 150° C., preferably about 50 to 80° C., and with a pressure of about 70 to 300 bar, preferably about 200 to 250 bar. Then, in the next step (step 340), the super critical fluid $CO_2$ is circulated as is (step 341), or alternatively a supply of additives is added to the super critical fluid $CO_2$ (step 342).

In step 342, small amounts of specially selected additives are supplied to remove the HSQ layer more effectively. For example, a fluorine based material such as HF or $NH_4F$, or an alcohol based material may be supplied as the additive(s). Further, HAFC may be supplied to cause kelation, thereby removing etch by-products more easily and effectively. In other embodiments, however, the supply of the additives may be omitted. Further, a controlled proportion of an inert gas such as $CO_2$, $H_2$, Ne, Ar, $N_2$, or the like may be supplied in order to control a concentration of the super critical fluid $CO_2$ inside the chamber.

Subsequently, the step of forming the super critical fluid $CO_2$ (step 330) and the step of either circulation of the super critical fluid $CO_2$ as is (step 341), or of supplying the additives (step 342) may be repeatedly performed until the removal of the HSQ layer is determined to be substantially completed (step 350). If the HSQ layer is substantially completely removed, then the etch residue and the etch by-products, which remained inside the chamber, are next removed (step 360), and the chamber is vented (step 370).

Finally, the wafer from which the HSQ layer has been removed in accordance with this invention is taken out of the chamber (step 380). Then, the wafer may be cleaned using deionized water or pure water (steps not shown on FIG. 4A).

Figure 4B:
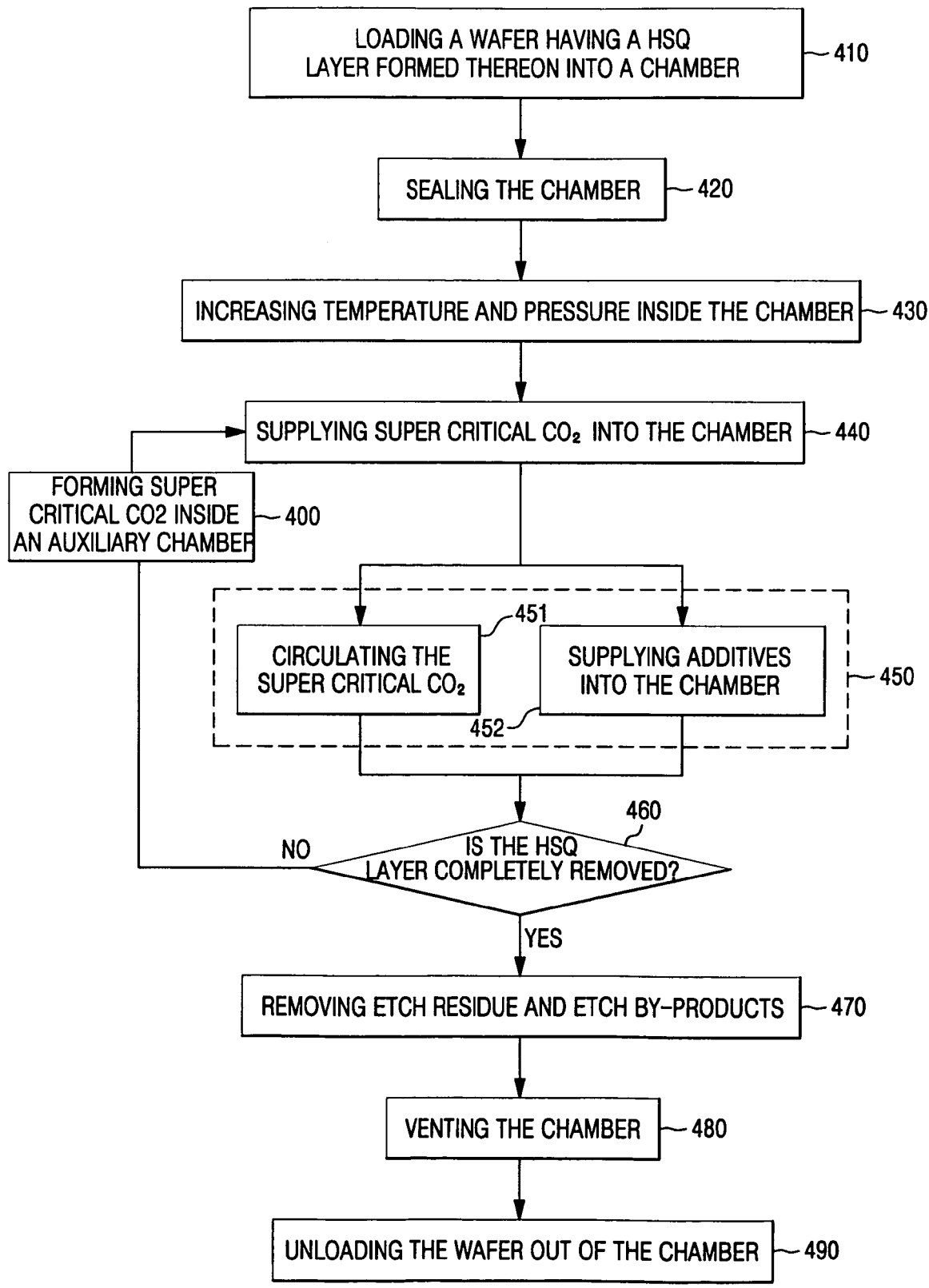

Hereinafter, a method of removing an HSQ layer using super critical fluid $CO_2$ according to another embodiment of the present invention will be explained in reference to the process flow diagram of FIG. 4B.

First, a wafer having an HSQ layer formed thereon is disposed inside a chamber (step 410).

Then, the chamber is sealed (step 420).

Then, a temperature and a pressure of the chamber are increased above a critical point for the material to be used for removal, in this example $CO_2$ (step 430). The temperature may be increased up to about 30 to 150° C., preferably to about 50 to 80° C., and the pressure is set at or raised to about 70 to 300 bar, preferably to about 200 to 250 bar.

Then, super critical fluid $CO_2$ is supplied into the chamber which is maintained with a pressure and a temperature above a critical point (step 440). In this invention embodiment, a formation of super critical fluid $CO_2$ is performed in another auxiliary chamber (step 400) and that super critical fluid $CO_2$ is supplied to the chamber. That is, $CO_2$ is supplied into the auxiliary chamber, and a temperature and a pressure are increased above a critical point, thereby forming the super critical fluid $CO_2$. Herein, the temperature is increased to about 30 to 150° C., preferably to about 50 to 80° C., and the pressure is set at or raised to about 70 to 300 bar, preferably to about 200 to 250 bar.

Then, in step 450, either the super critical fluid $CO_2$ is circulated as is (step 451), or alternatively a supply of additives can be added to the super critical fluid (step 452) as discussed above in connection with other invention embodiments.

Subsequently, the step of forming the super critical fluid $CO_2$ in the auxiliary chamber (step 400), the supply of the super critical fluid $CO_2$ into the chamber (step 440), and the circulation of the super critical fluid $CO_2$ as is (step 451), or of supplying the additives (step 452) can be repeatedly performed until the removal of the HSQ layer is determined to be substantially completed (step 460).

Then, the etch residue and the etch by-products, which remained inside the chamber, are next removed (step 470), and the chamber is vented (step 480).

Finally, the wafer from which the HSQ layer has been removed in accordance with this invention is taken out of the chamber (step 490). Subsequent cleaning steps (not shown in FIG. 4B) may then be performed on the wafer.

The present invention can be usefully employed in a formation method of a dual damascene interconnection of a microelectronic device intended for use in a large variety of applications such as a highly-integrated semiconductor device, a processor, an micro electro mechanical (MEM) device, an optoelectronic device, a display device, or in other microelectronic applications. Particularly, microelectronic devices prepared in accordance with the present invention can be effectively employed in a central processor unit (CPU) requiring a high speed operation, a digital signal processor (DSP), a combination of CPU and DSP, an application specific integrated circuit (ASIC), a logic circuit, an SRAM, or the like.

Hereinafter, a method of forming a dual damascene interconnection of a microelectronic device using a process step employing super critical fluid according to a further embodiment of the present invention will be explained in reference to FIGS. 5A through 5J.

Figure 5A:
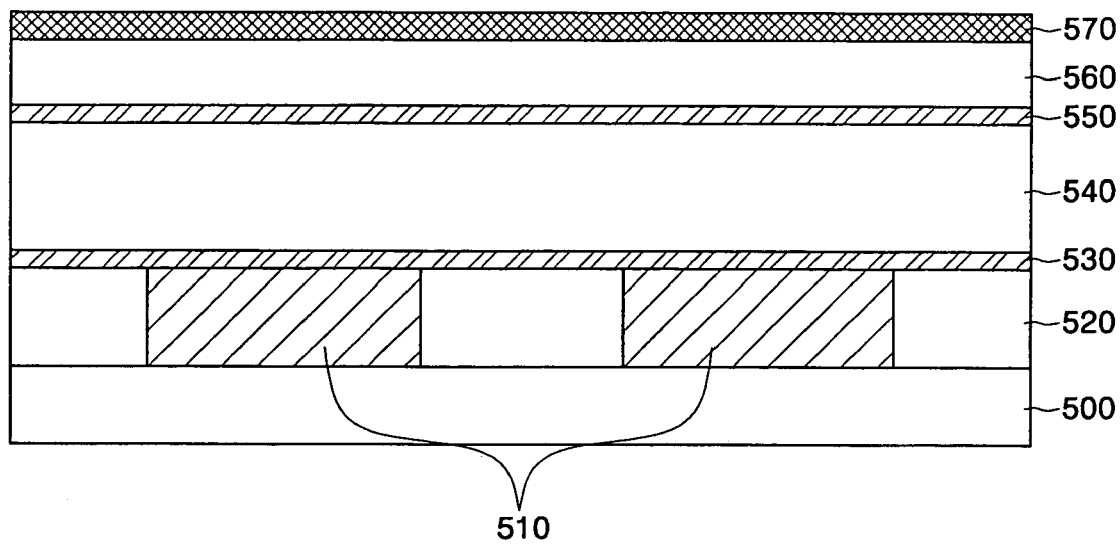
FIGS. 5A through 5J are schematic sectional views illustrating a sequence of process steps in a method of fabricating a dual damascene interconnection of a microelectronic device using super critical fluid according to a further embodiment of the present invention.

Referring to FIG. 5A, a suitable substrate 500 having lower interconnections 510, which are insulated by a first interlayer insulating layer 520, is prepared. Then, a via etch stop layer 530, a second interlayer insulating layer 540, a trench etch stop layer 550, a third interlayer insulating layer 560, and a capping layer 570 are sequentially formed on the lower interconnection 510 and the first interlayer insulating layer 520.

The substrate 500 may be a silicon substrate, a silicon on insulator (SOI) substrate, a gallium arsenic substrate, a silicon germanium substrate, a ceramic substrate, a quartz substrate, a glass substrate for display, or the like. The substrate 500 may have various kinds of active elements, passive elements, and the like as is generally known in the art formed thereon.

The lower interconnection 510 may be composed of various kinds of interconnection material, such as copper, copper alloy, aluminum, aluminum alloy, tungsten, tungsten alloy, or the like. In the interest of realizing a low resistance for interconnection 510, the lower interconnection 510 is preferably composed of copper.

The via etch stop layer 530 is formed to prevent or at least minimize the lower interconnection 510 from being exposed and attacked during a subsequent dry etch process of forming a via, and also during a process of removing a sacrificial layer, which remains after formation of a trench. The trench etch stop layer 550 is formed to more easily determine and control a depth of a trench, in which an upper interconnection will eventually be formed, and to protect an upper surface of the second interlayer insulating layer 540. If a depth of the trench can be effectively controlled by an etch rate and time, however, the step of forming the trench etch stop layer 550 can be selectively omitted. The via etch stop layer 530 and the trench etch stop layer 550 may be composed of a material having a high etch selectivity relative to the interlayer insulating layers 540, 560. Preferably, the via etch stop layer 530 and the trench etch stop layer 550 may be composed of SiC, SiN, SiCN, or the like material having a dielectric constant of about 4 to 5. In order to prevent an undesirable increase in the respective dielectric constants (k), the via etch stop layer 530 and the trench etch stop layer 550 are preferably minimized in thickness so as to be as thin as possible, but preferably still formed with a sufficient thickness to act as an etch barrier layer.

The interlayer insulating layers 540, 560 are preferably composed of a low-k dielectric material to prevent a delay of RC signals between interconnections and to minimize any increase in power consumption. The interlayer insulating layers 540, 560 may be composed of an organic material, an inorganic material, or a hybrid-type material having both properties of organic and inorganic materials, and they may be formed using a CVD or a spin-on method. Alternatively, the interlayer insulating layers 540, 560 may be composed of FSG (fluorinated silicate glass) or SiOC based materials in accordance with embodiments of the present invention. The SiOC based dielectric material may include SiOC:H, Black Diamond™ of Applied Material Co., CORAL™ of Movellous Co., and Aurora™ of ASM Co. Alternatively, the interlayer insulating layers 540, 560 may be composed of SiLK™ of Dow Chemical Co., or LKD™ of JSR Co.

The capping layer 570 is formed to prevent the interlayer insulating layer 560 from being damaged during the CMP process of planarizing a dual damascene interconnection. The capping layer 570 may be composed of $SiO_2$, SiOF, SiON, SiC, SiN, SiCN, or the like. Also, the capping layer 570 can function as a reflection preventive layer during a subsequent photolithography step in a process of forming a trench. In this case, the capping layer 570 is preferably selected from the group of $SiO_2$, SiON, SiC, and SiCN from among the broader above-described group of materials. However, in some cases, by a control of the CMP process, damage to the interlayer insulating layer 560 can be effectively prevented. Also, if a material layer which can act as a reflection preventive layer is formed in a subsequent process, a process of forming the capping layer 560 may be selectively omitted.

Figure 5B:
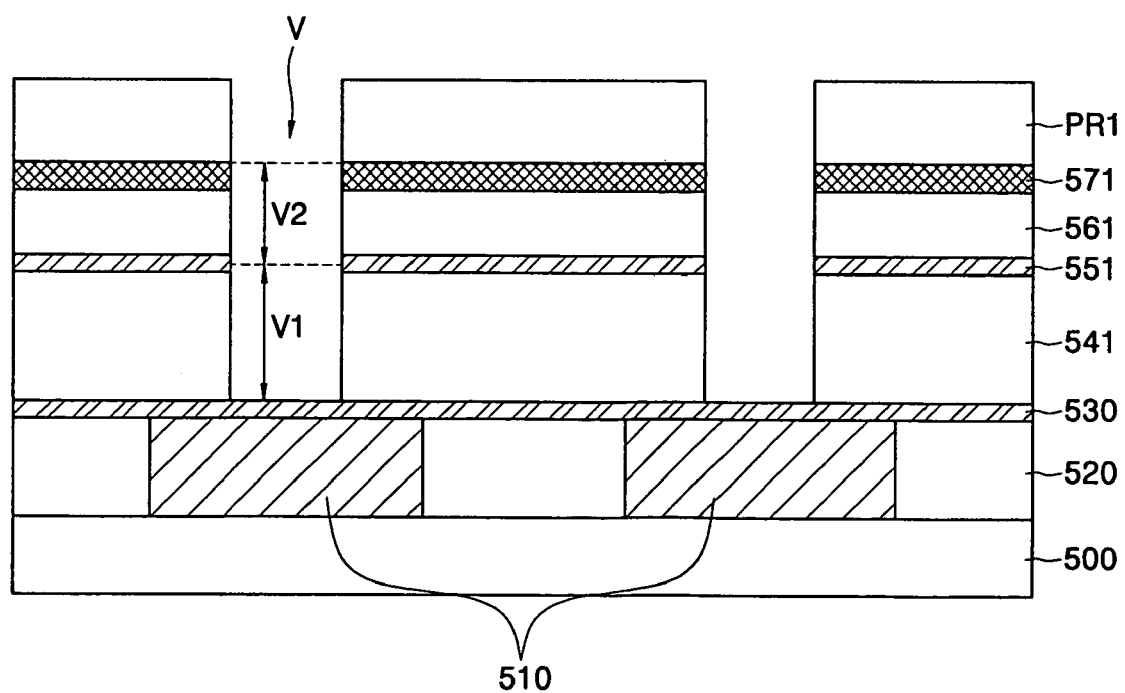

Referring to FIG. 5B, a photoresist pattern PR1 for defining a via is formed on the capping layer 570 as shown in FIG. 5A. The photoresist pattern PR1 is formed by depositing photoresist suitable for a light source having a wavelength generally lower than about 248 nm and performing an exposure and a development using a photo mask for defining a via. Then, the capping layer 570, the third interlayer insulating layer 560, the trench etch stop layer 550, and the second interlayer insulating layer 540 are dry-etched, using the photoresist pattern PR1 as an etch mask. In this step, one or more openings V are formed passing through a capping layer 571, an interlayer insulating layer 561, a trench etch stop layer 551, and an interlayer insulating layer 541, which are dry-etched. In FIG. 5B, the dry-etched layers 571, 561, 551 and 541 correspond respectively to the layers 570, 560, 550 and 540 in FIG. 5A prior to the dry-etching step. Each opening V comprises a via portion V1 and a preliminary trench portion V2, which extends upward from the via V1. A via etch stop layer 530 is exposed at the bottom of the via V1.

The interlayer insulating layers 540, 560 may be etched by an RIE method using an etching gas mixture including a main etch gas such as $C_xF_y$, $C_xH_yF_z$, wherein x, y and z are positive integers from 1 to about 10, or the like, in combination with an inert gas such as Ar, or the like, or alternatively an enhanced etching gas mixture formed by adding at least one gas selected from $O_2$, $N_2$, and $CO_x$ to the above etching gas mixture. Further, the conditions of the RIE process need to be controlled to selectively etch the interlayer insulating layer 540 without also etching the adjacent via etch stop layer 530.

Figure 5C:
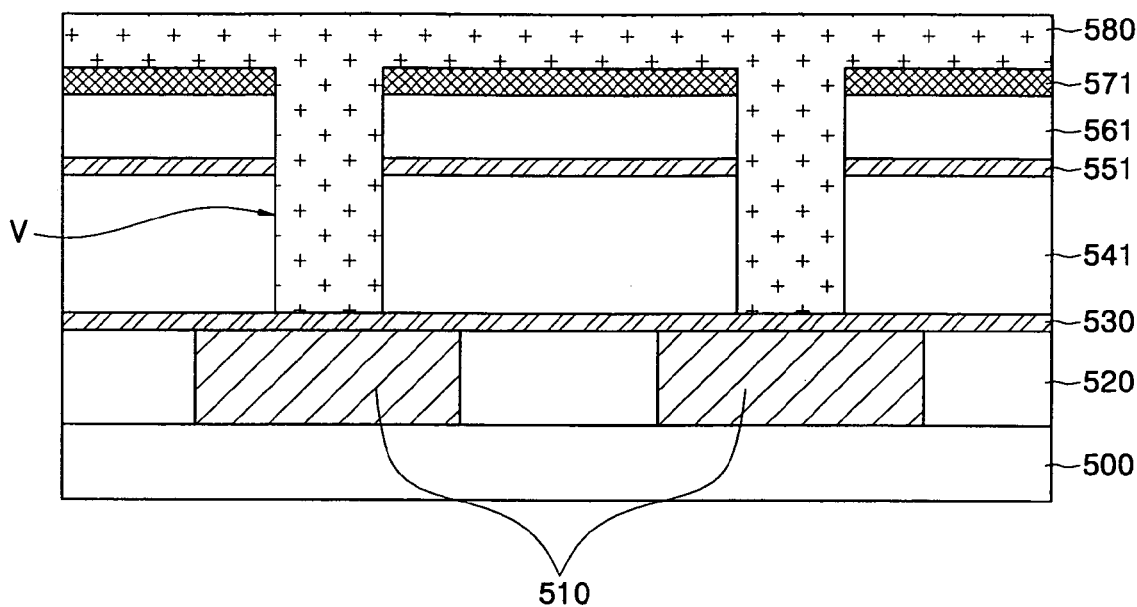

Referring to FIG. 5C, after the photoresist pattern PR1 as seen in FIG. 5B is removed, the opening(s) V is (are) filled with a sacrificial layer 580. The photoresist pattern PR1 may be removed by a $H_2$ based plasma treatment followed by a process using a stripper. The $H_2$ based plasma treatment may use a plasma of a gas selected from the group consisting of $H_2$, $N_2/H_2$, $NH_3/H_2$, $He/H_2$, or a mixture thereof. Alternatively, the photoresist pattern PR1 may be removed using an $O_2$ ashing treatment, which is generally used for a removal of a photoresist pattern. However, in invention embodiments where the interlayer insulating layers 541, 561 are composed of an organic material, since such organic interlayer insulating layers 541, 561 may be damaged by the $O_2$ plasma treatment, it is more preferable to use an $H_2$ based plasma treatment to remove the photoresist pattern.

The sacrificial layer 580 is composed of a material having an excellent gap fill property. Further, the sacrificial layer 580 is advantageously composed of a material which has a dry etch rate substantially identical to that of the interlayer insulating layer 561, or a material selected such that the etch ratio of the sacrificial layer 580 to the interlayer insulating layer 561 is about 4:1 or lower. Further, the sacrificial layer 580 may be composed of a material which is wet-etched very fast relative to the interlayer insulating layers 541, 561. For example, the sacrificial layer 580 may be composed of a material selected such that the wet etch ratio of the sacrificial layer 580 to the interlayer insulating layers 541, 561 is about 20:1 or higher. Alternatively, the sacrificial layer 580 may be composed of a material that is able to prevent a basic material (such as nitrogen or amine contained inside the interlayer insulating layers 541, 561) from being diffused into the photoresist layer during a subsequent exposure process of forming the photoresist pattern for defining a trench. In accordance with further embodiments of the present invention, the sacrificial layer 580 may be composed of hydrogen silsesquioxane (HSQ), borophosphosilicate glass (BPSG), phosphosilicate glass (PSG), fluorinated silicate glass (FSG), methyl silsesquioxane (MSQ), or photoresist. The photoresist may be photoreist for i-line, ArF, or KrF. The sacrificial layer 580, which is selected to have a dry etch selectivity substantially identical to that of the interlayer insulating layer 561 comprising a hybrid type of organic and inorganic materials, and which also is selected to have a relatively high, wet etch selectivity relative to that of the interlayer insulating layers 561, 541, is preferably comprised of a carbon-free inorganic material. HSQ is the preferred material among such carbon-free inorganic materials. Further, the sacrificial layer 580 also preferably includes a light absorbing material and/or a dissolution inhibiting agent. The dissolution inhibiting agent is a material capable of suppressing the dissolution of the photoresist to a developing solution, and a typical material known to those skilled in the art can be used. In this specification, all HSQ materials, including pure HSQ, and HSQ including additives such as a light absorbing material and/or a dissolution inhibiting agent, are commonly referred to as a "HSQ based material."

The sacrificial layer 580 may be formed by a spin-on method. The sacrificial layer 580 may fill an entire inner portion, or a partial inner portion of each opening V. Further, the sacrificial layer 580 may cover even an upper surface of the capping layer 571. The latter case is typically preferable because this helps to control of process margin conditions. If the sacrificial layer 580 is composed of a HSQ based material, a thickness of the sacrificial layer 580 can be easily controlled in the coating recipe, in particular control of variables such as a distance between the openings V, a width and a height of the openings V, or the like.

In addition, a surface of the sacrificial layer 580 can be plasma-treated. Such plasma treatment is performed using plasma of $O_2$, $H_2$, He, $NH_3$, $N_2$, Ar, or a mixture thereof, at a temperature ranging from a room temperature to about 500° C. for a period of about 1 to 120 sec. The surface of the sacrificial layer 580 may be densified by such a plasma treatment. One of the purposes of the plasma treatment is to prevent the sacrificial layer from being dissolved in a photoresist developing solution. Therefore, the plasma treatment step herein described may be omitted in cases where the sacrificial layer includes an effective dissolution inhibiting agent. Further, the plasma treatment can be omitted in cases where a reflection preventive layer is formed on the sacrificial layer 580, and the sacrificial layer 580 is effectively protected from the developing solution by such reflection preventive layer.

Figure 5D:
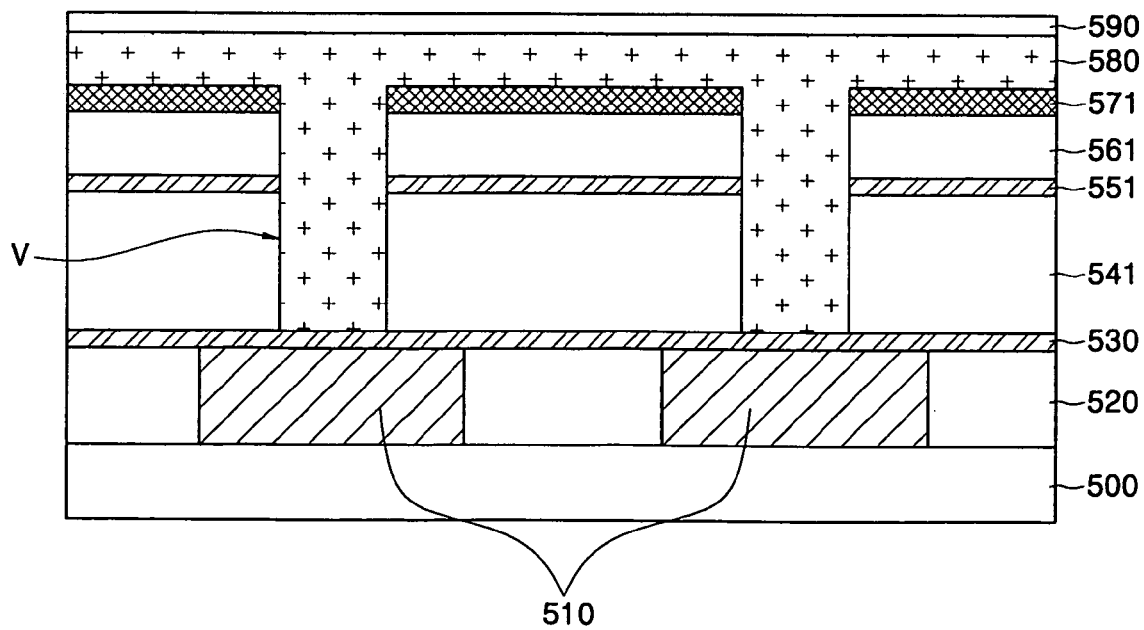

Referring to FIG. 5D, a reflection preventive layer 590 is formed on the plasma-treated sacrificial layer 580 of FIG. 5C. Either an inorganic reflection preventive layer or an organic reflection preventive layer can be effectively used for the reflection preventive layer 590, but an organic reflection preventive layer is often advantageous because it has a property of being easily removable. The reflection preventive layer 590 may comprise a reflection preventive material capable of absorbing light having a wavelength of about 248 nm, or about 193 nm, or light having a lower wavelength, as is known by those skilled in this art. The reflection preventive layer 590 may advantageously be formed with a thickness of about 500 to 700 Å.

Figure 5E:
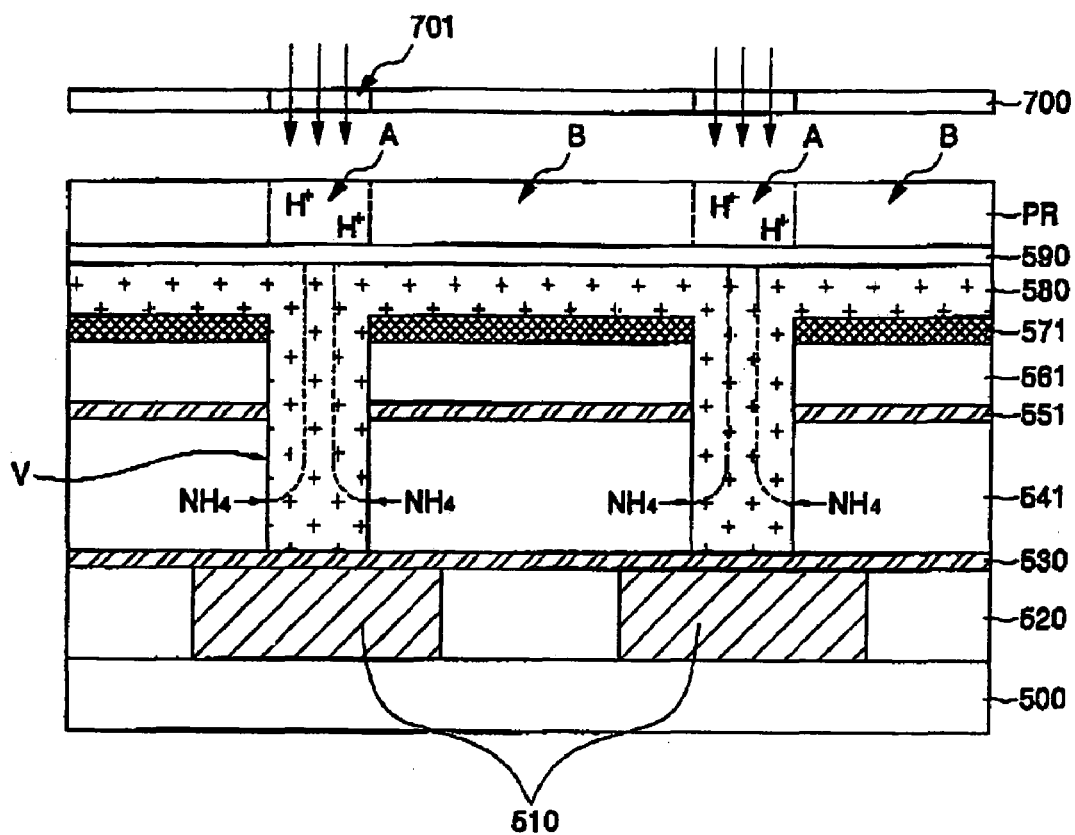

Referring to FIG. 5E, a new photoresist layer PR is formed on the reflection preventive layer 590 of FIG. 5D. After forming the photoresist layer PR, the photoresist layer PR is treated by an exposure process using a mask 700 for defining a trench. If a light source having a wavelength of 248 nm, 193 nm, or lower than that passes through a transmission region 701 of the mask 700 and is irradiated on the photoresist layer PR, acid ($H^+$) is generated from acid-generating materials in the photoresist layer PR by action of light in the exposure of one or more exposure regions A of the photoresist layer PR. The exposure regions A of the photoresist layer PR are hydrolyzed by the acid ($H^+$) such that the affected portions of the photoresist layer PR become soluble in the developing solution. Thus, non-exposure regions B of the layer PR are not dissolved in the developing solution and remain along the surface of layer 590. The reflection preventive layer 590 functions to prevent the light from penetrating beyond the exposure portion A of the photoresist layer PR, and instead that light is reflected through the photoresist layer PR during an exposure. Alternatively, if the sacrificial layer 580 includes a light absorbing material, since the sacrificial layer 580 has a reflection prevention/light absorption function, the process step of forming the reflection preventive layer 590 may be omitted. The light-initiated acid hydrolysis step described above becomes more active by a bake step after the light exposure. The sacrificial layer 580 functions as a diffusion barrier layer against nitrogen or amine during the light exposure step and the bake step after exposure. Therefore, this procedure helps to prevent etch gas, used for a formation of an opening V, or basic materials such as nitrogen, amine, or the like, which may remain on surfaces of the interlayer insulating layers 541, 561 following a plasma treatment for removing the photoresist pattern PR1 (FIG. 5B), from being diffused along the sacrificial layer 580, and also helps to neutralize the acid generated in the exposure regions A of the photoresist layer PR, which otherwise could result in a failure of the photoresist pattern.

Figure 5F:
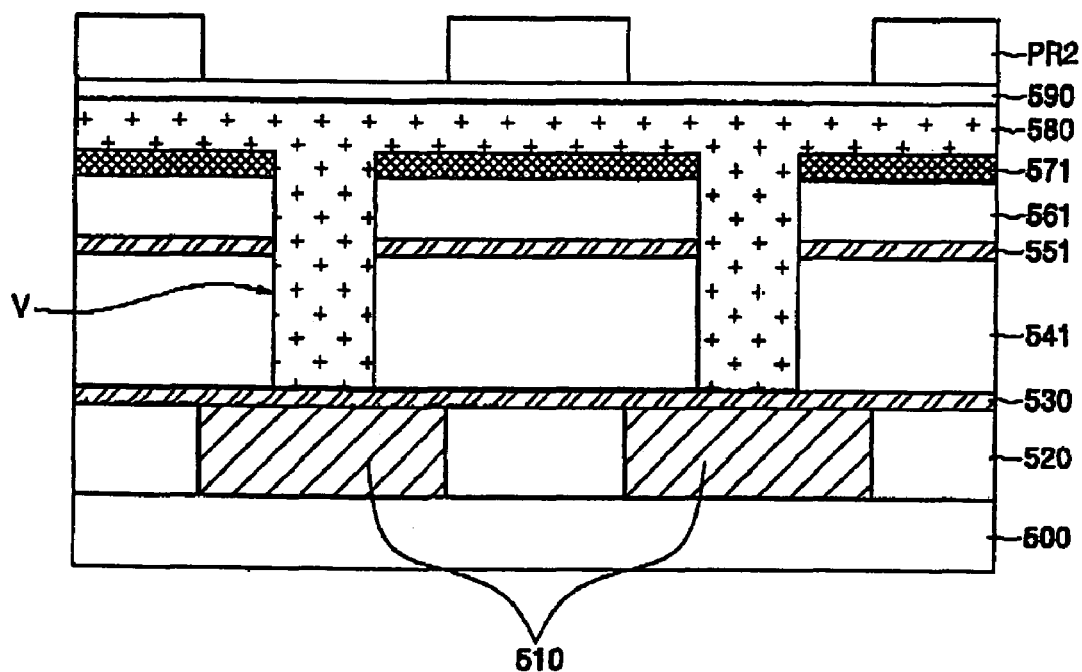

Referring to FIG. 5F, a photoresist pattern PR2 for defining a trench is formed along the light-treated photoresist layer PR of FIG. 5E. The post-exposure baked photoresist layer PR is immersed into a tetra methyl ammonium hydroxide developing solution, resulting in only the exposure regions A being dissolved in the developing solution and thereby removed, thereby forming the photoresist pattern PR2 as shown in FIG. 5F. Since the reflection preventive layer 590 is disposed under the exposure regions A (FIG. 5E), the sacrificial layer 580 is not exposed to the developing solution during this process step. If the sacrificial layer 580 has previously been plasma-treated, as earlier described, even though the reflection preventive layer 590 is not formed, the sacrificial layer 580 will not be damaged by the developing solution. Alternatively, if the sacrificial layer 580 includes a dissolution inhibiting agent, even though the reflection preventive layer 590 is not formed, the sacrificial layer 580 will not be damaged by the developing solution.

Figure 5G:
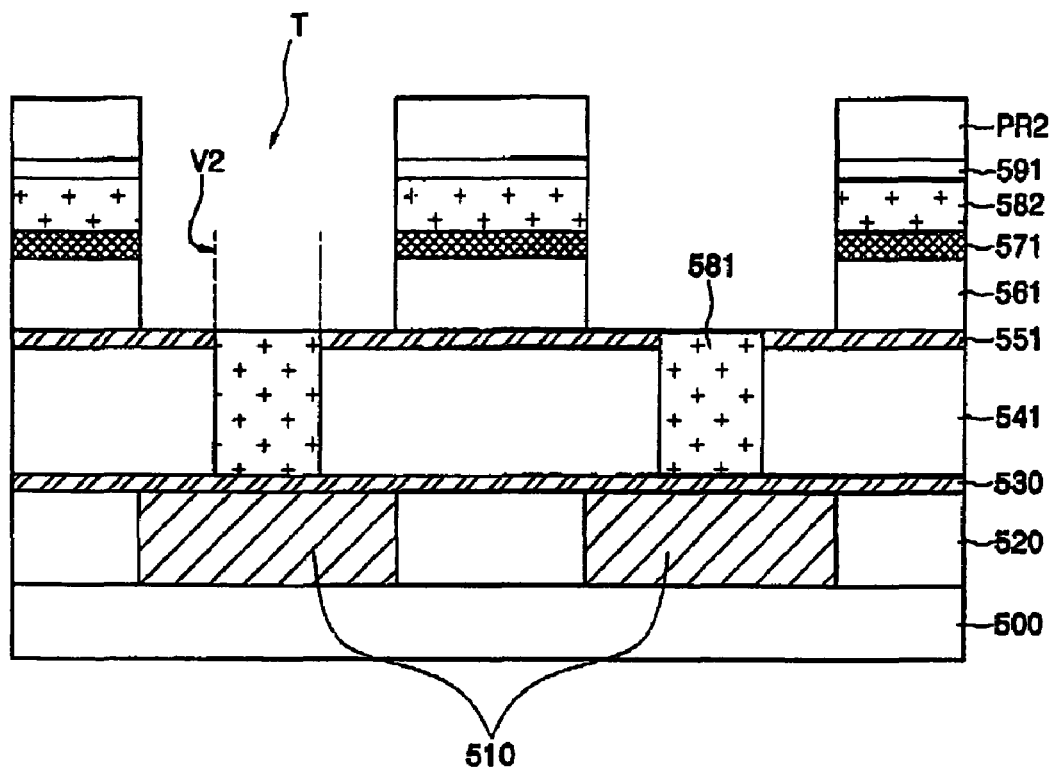

Referring to FIG. 5G, the reflection preventive layer 590, the sacrificial layer 580, and the capping layer 571, as seen in FIG. 5F, are sequentially etched using the photoresist pattern PR2 as an etch mask. Next, the interlayer insulating layer 561 and the sacrificial layer 580 are etched down to a predetermined depth, thereby forming a trench T generally in the same region of the device as the preliminary trench V2. In FIG. 5G, the etched reflection preventive layer 590 is identified as "591," the portions of the etched sacrificial layer 580 between layers 571 and 591 are identified as "582," and the portions of the sacrificial layer 580 remaining in the openings V are identified as "581." The trench T is typically formed by a dry etching process, and the dry etching process is performed under such conditions that the etch rates of the interlayer insulating layer 561 and the sacrificial layer 580 are substantially identical, or such that the etch ratio of the sacrificial layer 580 to the interlayer insulating layer 561 is about 4:1 or less. This etching process is performed until the trench etch stop layer 551 is exposed. In embodiments where the trench etch stop layer 551 is not formed, a depth of the trench T may be adjusted by controlling the etch rate of the interlayer insulating layer 561 and the etching time thereof. After forming the trench T, portions 581, 582 of sacrificial layer 580 remain respectively inside the via V1 (see FIG. 5H) and on the capping layer 571. As such, since the via V1 is filled with the sacrificial layer 581, the via etch stop layer 530 is not exposed, and the lower interconnection 510 is protected. In embodiments where the interlayer insulating layer 561 is composed of an inorganic material and the sacrificial layer 580 (including remaining portions 581 and 582) is composed of HSQ based material, the above conditions can be satisfied by performing RIE and using an etching gas mixture including a main etch gas such as $C_xF_y$, $C_xH_yF_z$, wherein x, y and z are positive integers from 1 to about 10, or the like, in combination with an inert gas such as Ar, or alternatively using an enhanced etching gas mixture formed by adding at least one gas selected from $O_2$, $N_2$, and $CO_x$ to the above etching gas mixture.

Figure 5H:
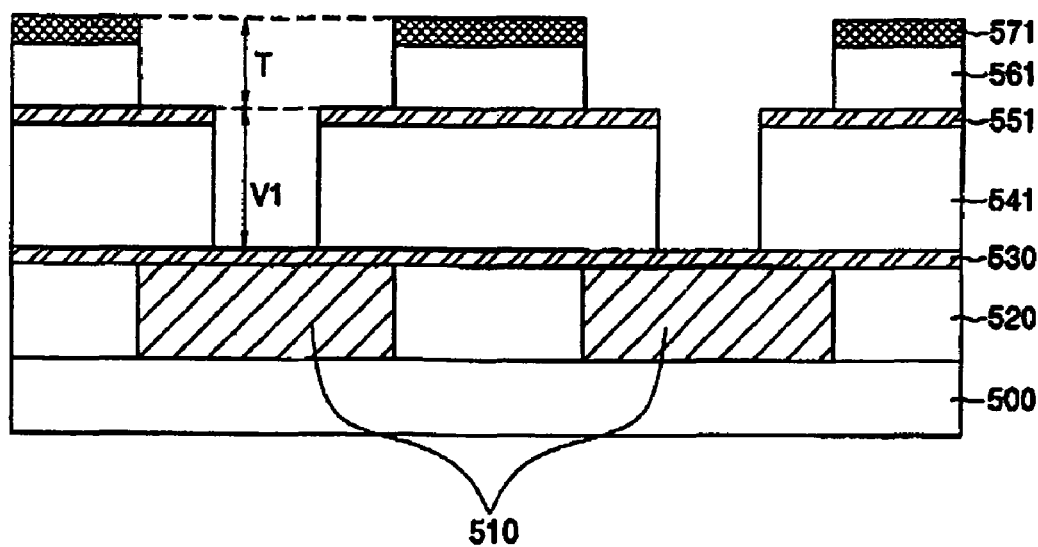

FIG. 5H is a schematic sectional view illustrating a resultant structure in which the photoresist pattern PR2 and the remaining sacrificial layer portions 581, 582 from inside the via V1 and on the capping layer 571, as seen in FIG. 5G, are removed. Since the sacrificial layer 581 inside the via V1 is removed, the via etch stop layer 530 on the bottom of the via V1 is now exposed.

The sacrificial layer portions 581, 582 are removed using super critical fluid in accordance with this invention. Preferably, the sacrificial layer portions 581, 582 may be removed using super critical fluid $CO_2$, for example in accordance with one of the processing sequences shown in FIGS. 4A and 4B. That is, a suitable substrate 500, which has been prepared in accordance with the processes as shown in FIGS. 5A-5G, is introduced into a chamber and the chamber is sealed. Then, in one invention embodiment, $CO_2$ is supplied into the chamber, to generate super critical fluid $CO_2$ under process conditions wherein the temperature is about 30 to 150° C., preferably about 50 to 80° C., and pressure is established at about 70 to 300 bar, preferably at about 200 to 250 bar. In order to remove the sacrificial layers 581, 582 more effectively, one or more specially selected additives may be supplied into the chamber together with the super critical fluid. Such additives may include fluorine based materials such as HF or $NH_4F$, or alcohol based materials. Further, HAFC may also be supplied to the chamber to easily remove etch by-products by causing kelation. Further, HMDS or TMCS may also be added to the chamber as a_moisture proofing material to protect the interlayer insulating layers 541, 561 during this treatment step. In some invention embodiments, the step(s) of supplying the various additives may be omitted. The steps of producing and circulating the super critical fluid $CO_2$, or other suitable super critical fluid, and a supply of the additives, may be repeatedly performed until the sacrificial layer portions 581, 582 are substantially completely removed. Additionally, an inert gas such as $CO_2$, $H_2$, Ne, Ar, $N_2$, or the like, can be supplied in order to control a concentration of the super critical fluid $CO_2$ inside the chamber. In subsequent steps, etch residue and etch by-products, which may remain inside the chamber, are removed, and the chamber is vented. The substrate from which the sacrificial layer portions have been removed, as shown in FIG. 5H, is taken out of the chamber, and the substrate may then be cleaned using deionized water or pure water.

In one embodiment of this invention, the photoresist pattern PR2 and the sacrificial layer portions 581, 582 may be concurrently removed using super critical fluid. Alternatively, before or after removing the sacrificial layer portions 581, 582 using the super critical fluid, the photoresist pattern PR2 may be removed. In the case of removing the photoresist pattern PR2 separately, hydrogen based plasma generated from $H_2$, $N_2/H_2$, $NH_3/H_2$, $He/H_2$, or a mixture thereof may be used for this removal step.

Figure 5I:
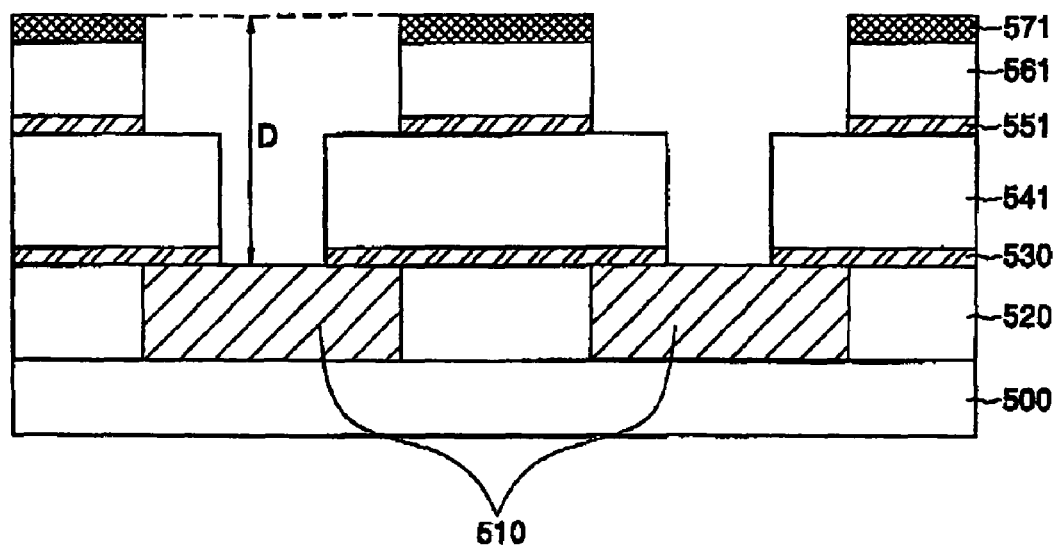

Referring to FIG. 5I, the via etch stop layer 530 exposed on the bottom of the via V1 in FIG. 5H is now etched, thereby exposing the lower interconnection 510. Therefore, a dual damascene interconnection region D, which includes the previously-formed trench T and the via V1, is formed. An etching process of the via etch stop layer 530 should preferably be performed under such etch conditions that this etching step does not affect the lower interconnection 510, and such that only the portions of the via etch stop layer 530 under via V1 are selectively etched and removed.

Figure 5J:
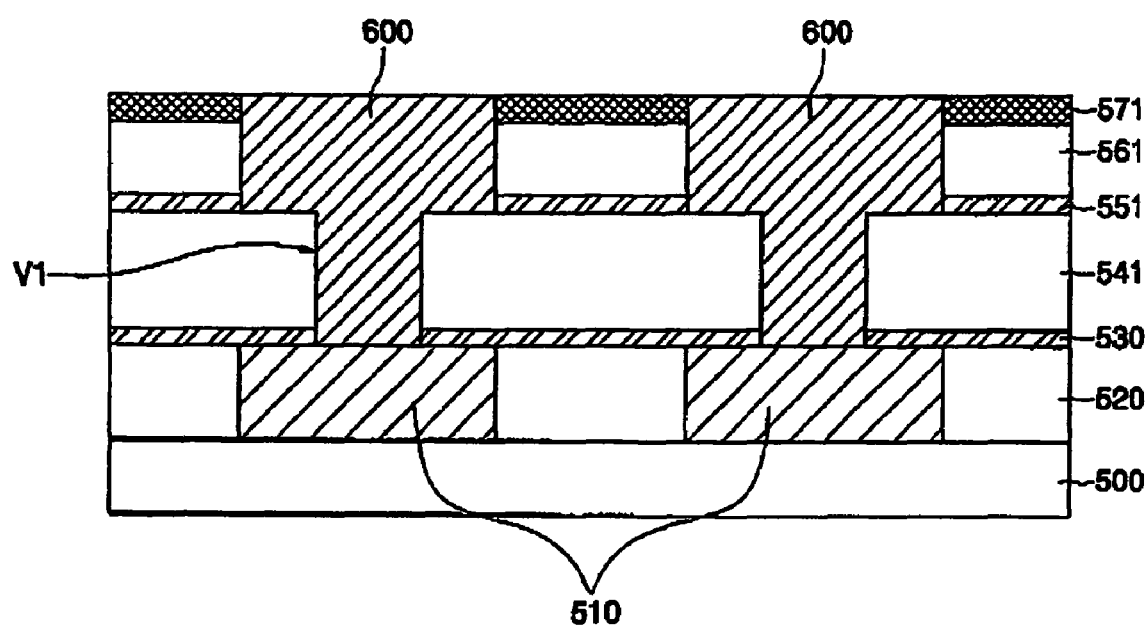

Referring to FIG. 5J, in the next fabrication step a conductive layer is formed on the substrate 500 of FIG. 5I having the dual damascene interconnection region D, and a planarization is then performed thereon, thereby forming a dual damascene interconnection 600. The conductive layer forming the dual damascene interconnection 600 may include aluminum, tungsten, copper, or alloy thereof, wherein copper is especially preferred because it has a property of low electrical resistance. Further, the conductive layer may be formed with a stack structure, including a diffusion barrier layer and a main interconnection layer, and it may be modified in various ways and configurations, using technology known to those skilled in the art.

Methods of forming via-first dual damascene interconnections according to certain preferred embodiments of the present invention have been explained above. However, it will be understood that the present invention can be also employed with minor modifications for methods of fabricating trench-first dual damascene or single damascene interconnections in reference to FIGS. 5A to 5J.

As explained above, according to the present invention a material layer is removed using a super critical fluid, which can penetrate easily, thereby improving an etch efficiency while avoiding or minimizing damage to the partially fabricated device. Particularly, in the dual damascene interconnection formation process for a microelectronic device, the sacrificial layer, or at least remaining portions of a sacrificial layer, are removed using super critical fluid, thereby preventing a possible damage to the capping layer. Specifically, by removing the sacrificial layer using super critical fluid $CO_2$, $OH^-$ is prevented from attaching to a surface of a low-k dielectric interlayer insulating layer as might occur during a wet etching process. Thus, an undesirable increase of a dielectric constant of a low-k dielectric interlayer insulating layer can be effectively suppressed. Further, in a preferred embodiment where the sacrificial layer is removed using super critical fluid $CO_2$ capable of effectively removing $OH_-$, $OH^-$ which may be attached to a surface of an interlayer insulating layer from an earlier processing step prior to the process of removing the sacrificial layer can be removed. Further, the sacrificial layer and the photoresist pattern may be concurrently removed using super critical fluid in accordance with this invention. Therefore, an extra process, such as an ashing process for removing the photoresist or the like, may be omitted thereby realizing simplification of the overall fabrication process.

While the present invention has been particularly shown and described through exemplary embodiments thereof with reference to the accompanying drawings, it will be understood by those of ordinary skill in the art that various changes in form and details may be made therein without departing from the spirit and scope of the present invention as defined by the following claims.

Having described the invention, what is claimed is:

1. In a method of fabricating a microelectronic device wherein, during an intermediate fabrication step, a semiconductor substrate has both a sacrificial layer formed of an HSQ-based material covering at least a portion of the substrate and also a second material layer in proximity to the sacrificial layer such that a conventional etching process to remove the sacrificial layer might damage the second material layer,
the improvement comprising:
using super critical fluid $CO_2$ to remove the entire sacrificial layer without damaging the second material layer.

2. The method according to claim 1, wherein the process of removing the sacrificial layer comprises the steps of:
loading the substrate having both the sacrificial layer and the second material layer into a chamber;
supplying $CO_2$ into the chamber; and
converting the $CO_2$ inside the chamber to super critical fluid $CO_2$.

3. The method according to claim 2, wherein the process of converting the $CO_2$ inside the chamber to super critical fluid $CO_2$ is performed at a temperature of about 30 to 150° C. and with a pressure of about 70 to 300 bar.

4. The method according to claim 2, wherein the process of converting the $CO_2$ inside the chamber to super critical fluid $CO_2$ is performed at a temperature of about 50 to 80° C. and with a pressure of about 200 to 250 bar.

5. The method according to claim 2, further comprising the step of supplying a fluorine based material or an alcohol based material into the chamber during the step of removing the sacrificial layer.

6. The method according to claim 1, wherein the process of removing the sacrificial layer comprises the steps of:
loading the substrate having both the sacrificial layer and the second material layer into a chamber;
converting $CO_2$ to super critical fluid $CO_2$ outside the chamber; and
supplying the super critical fluid $CO_2$ into the chamber.

7. The method according to claim 6, wherein the conversion of $CO_2$ to super critical fluid $CO_2$ outside the chamber is performed at a temperature of about 30 to 150° C. and with a pressure of about 70 to 300 bar.

8. The method according to claim 6, wherein the conversion of $CO_2$ to super critical fluid $CO_2$ outside the chamber is performed at a temperature of about 50 to 80° C. and with a pressure of about 200 to 250 bar.

9. The method according to claim 6, further comprising the step of supplying a fluorine based material or an alcohol based material into the chamber during the step of removing the sacrificial layer.

10. In a method of fabricating a microelectronic device comprising the sequential steps of:

(a) preparing a semiconductor substrate;
(b) forming an interlayer insulating layer on the substrate;
(c) selectively etching the interlayer insulating layer, thereby forming an opening inside the interlayer insulating layer;
(d) forming a sacrificial layer consisting essentially of a material selected from the group consisting of HSQ, BPSG, PSG, FSG and MSQ for filling at least a portion of the opening;
(e) forming an etch mask for exposing the sacrificial layer and the interlayer insulating layer around the opening;
(f) selectively etching the interlayer insulating layer and the sacrificial layer, which are exposed after forming the etch mask, thereby exposing an upper portion of the opening;
(g) removing the sacrificial layer;
(h) removing the etch mask; and
(i) forming a conductive layer pattern inside the opening;
the improvement comprising carrying out step (g) using super critical fluid to remove the entire sacrificial layer without damaging other layers.

11. The method according to claim 10, wherein the etch mask is composed of photoresist.

12. The method according to claim 11, wherein the processes of removing the sacrificial layer and the etch mask are concurrently performed.

13. The method according to claim 10, wherein the super critical fluid is super critical fluid $CO_2$.

14. The method according to claim 13, wherein the sacrificial layer is removed using the super critical fluid $CO_2$ and at least one additive selected from the group consisting of a fluorine based material, an alcohol based material, HMDS, and TMCS.

15. In a method of fabricating a microelectronic device comprising the sequential steps of:

(a) preparing a semiconductor substrate having a lower interconnection;
(b) forming an etch stop layer for covering the lower interconnection;
(c) forming an interlayer insulating layer as a low-k dielectric material on the etch stop layer;
(d) etching the interlayer insulating layer until the etch stop layer is exposed, thereby forming an opening inside the interlayer insulating layer, the opening including a via exposing the etch stop layer at a bottom thereof and also including a preliminary trench extending from the via;
(e) forming a sacrificial layer, composed of a HSQ based material together with a dissolution-inhibiting agent, for filling at least a portion of the opening;
(f) forming a photoresist pattern for exposing the sacrificial layer and the interlayer insulating layer around the opening;
(g) etching the interlayer insulating layer and the sacrificial layer exposed after the photoresist pattern is formed, thereby forming a trench extending from the preliminary trench;
(h) removing concurrently the sacrificial layer and the photoresist pattern;
(i) removing the etch stop layer, thereby exposing the lower interconnection; and
(j) filling the via and the trench with a conductive layer, thereby forming an upper interconnection which is connected to the lower interconnection through the via;

the improvement comprising carrying out step (h) using super critical fluid $CO_2$ to remove the entire sacrificial layer and photoresist pattern without damaging the other layers.

16. The method according to claim 15, wherein the sacrificial layer further includes a light absorbing material.

17. The method according to claim 15, further comprising the step of plasma-treating a surface of the sacrificial layer after the step (e) of forming the sacrificial layer.

18. The method according to claim 17, wherein the interlayer insulating layer consists essentially of FSG or SiOC based materials.

19. The method according to claim 18, further comprising the step of forming a capping layer on the interlayer insulating layer after the step (c) of forming the interlayer insulating layer, and wherein the opening of step (d) is formed by selectively etching the capping layer and the interlayer insulating layer.

20. The method according to claim 16, wherein the sacrificial layer is removed by supplying a fluorine based material, an alcohol based material, HMDS, or TMCS.

21. The method according to claim 10, wherein the process of removing the sacrificial layer comprises the steps of:
    loading the substrate having both the sacrificial layer and the second material layer into a chamber;
    supplying $CO_2$ into the chamber; and
    converting the $CO_2$ inside the chamber to super critical fluid $CO_2$.

22. The method according to claim 21, wherein the process of converting the $CO_2$ inside the chamber to super critical fluid $CO_2$ is performed at a temperature of about 30 to 150° C. and with a pressure of about 70 to 300 bar.

23. The method according to claim 21, further comprising the step of supplying a fluorine based material or an alcohol based material into the chamber during the step of removing the sacrificial layer.

24. The method according to claim 10, wherein the process of removing the sacrificial layer comprises the steps of:
    loading the substrate having both the sacrificial layer and the second material layer into a chamber;
    converting $CO_2$ to super critical fluid $CO_2$ outside the chamber; and
    supplying the super critical fluid $CO_2$ into the chamber.

25. The method according to claim 24, wherein the conversion of $CO_2$ to super critical fluid $CO_2$ outside the chamber is performed at a temperature of about 30 to 150° C. and with a pressure of about 70 to 300 bar.

26. The method according to claim 24, further comprising the step of supplying a fluorine based material or an alcohol based material into the chamber during the step of removing the sacrificial layer.

27. The method according to claim 15, wherein the process of removing the sacrificial layer comprises the steps of:
    loading the substrate having both the sacrificial layer and the second material layer into a chamber;
    supplying $CO_2$ into the chamber; and
    converting the $CO_2$ inside the chamber to super critical fluid $CO_2$.

28. The method according to claim 27, wherein the process of converting the $CO_2$ inside the chamber to super critical fluid $CO_2$ is performed at a temperature of about 30 to 150° C. and with a pressure of about 70 to 300 bar.

29. The method according to claim 15, wherein the process of removing the sacrificial layer comprises the steps of:
    loading the substrate having both the sacrificial layer and the second material layer into a chamber;
    converting $CO_2$ to super critical fluid $CO_2$ outside the chamber; and
    supplying the super critical fluid $CO_2$ into the chamber.

30. The method according to claim 29, wherein the conversion of $CO_2$ to super critical fluid $CO_2$ outside the chamber is performed at a temperature of about 30 to 150° C. and with a pressure of about 70 to 300 bar.

* * * * *